United States Patent [19]

Bruce et al.

[11] Patent Number: 6,107,107
[45] Date of Patent: Aug. 22, 2000

[54] ANALYZING AN ELECTRONIC CIRCUIT FORMED UPON A FRONTSIDE SURFACE OF A SEMICONDUCTOR SUBSTRATE BY DETECTING RADIATION EXITING A BACKSIDE SURFACE COATED WITH AN ANTIREFLECTIVE MATERIAL

[75] Inventors: Victoria J. Bruce; Gregory A. Dabney, both of Austin, Tex.

[73] Assignee: Advanced Micro Devices, Inc., Sunnyvale, Calif.

[21] Appl. No.: 09/052,221

[22] Filed: Mar. 31, 1998

[51] Int. Cl.$^7$ .......................... G01R 31/26; H01L 21/66; H01L 21/00

[52] U.S. Cl. ............................. 438/14; 438/17; 438/57; 438/72

[58] Field of Search ................................. 438/14, 17, 57, 438/72

[56] References Cited

U.S. PATENT DOCUMENTS

| | | |
|---|---|---|
| 4,218,143 | 8/1980 | Bottka . |
| 4,680,635 | 7/1987 | Khurana . |
| 4,681,449 | 7/1987 | Bloom et al. . |
| 4,698,587 | 10/1987 | Burns et al. . |
| 4,755,874 | 7/1988 | Esrig et al. . |
| 4,758,092 | 7/1988 | Heinrich et al. . |
| 4,811,090 | 3/1989 | Khurana . |
| 5,164,664 | 11/1992 | Soelkner . |
| 5,301,006 | 4/1994 | Bruce . |
| 5,430,305 | 7/1995 | Cole, Jr. et al. . |
| 5,532,873 | 7/1996 | Dixon . |
| 5,631,571 | 5/1997 | Spaziani et al. . |
| 5,661,520 | 8/1997 | Bruce . |
| 5,821,135 | 10/1998 | Mei et al. . |

OTHER PUBLICATIONS

Sahara et al., Electrooptic Sampling Evaluation of 1.5 um Metal–Semiconductor–Metal Photodiodes by Soliton Compressed Semiconductor Laser Pulses, IEEE Journal of Quantum Electronics, pp. 120–125, Jan. 1995.

Search Report for Application No. PCT/US 98/22023 mailed Aug. 10, 1999.

Duvillaret et al., "Absolute Voltage Measurements of III–V Integrated Circuits by Internal Electro–Optic Sampling," *Electronic Letters*, vol. 31, No. 1, Jan. 5, 1995, pp. 23–24.

(List continued on next page.)

*Primary Examiner*—John F. Niebling
*Assistant Examiner*—J. Jones
*Attorney, Agent, or Firm*—Kevin L. Daffer; Conley, Rose & Tayon

[57] ABSTRACT

Various methods are described for analyzing an electronic circuit formed upon a frontside surface of a semiconductor substrate having opposed frontside and backside surfaces. Each method includes forming a layer of an antireflective coating material upon the backside surface of the substrate prior to detecting electromagnetic radiation emanating from the backside surface. The layer of an antireflective coating material reduces reflections which contribute to background noise levels. As a result of reduced background noise levels, the detection capabilities of the methods and the resolutions of any scanned images produced using the methods are improved. A first method includes forming a layer of an antireflective coating material upon the backside surface of the substrate, directing a beam of electromagnetic radiation toward the backside surface of the substrate, and detecting an electrical response from the electronic circuit. A second method includes the forming of the layer of an antireflective coating material upon the backside surface of the substrate, directing the beam of electromagnetic radiation toward the backside surface of the substrate, and detecting a portion of the beam of electromagnetic radiation reflected by the electronic circuit. A third method includes forming the layer of antireflective coating material upon the backside surface of the substrate, supplying electrical power to the electronic circuit such that any crystalline defects within the electronic circuit result in the emission of electromagnetic radiation, and detecting a portion of the electromagnetic radiation exiting the semiconductor substrate through the backside surface.

33 Claims, 8 Drawing Sheets

OTHER PUBLICATIONS

Sahara et al., "Electrooptic Sampling Evaluation of 1.5 μm Metal–Semiconductor–Metal Photodiodes by Soliton Compressed Semiconductor Laser Pulses," *IEEE Journal of Quantum Electronics,* vol. 31, No. 1, Jan. 1, 1995.

Annex to Form PCT/ISA/206 Communication Relating to the Results of the Partial International Search for app. No. PCT/US 98/22023 mailed Feb. 15, 1999.

ANALYZING AN ELECTRONIC CIRCUIT FORMED UPON A FRONTSIDE SURFACE OF A SEMICONDUCTOR SUBSTRATE BY DETECTING RADIATION EXITING A BACKSIDE SURFACE COATED WITH AN ANTIREFLECTIVE MATERIAL

BACKGROUND OF THE INVENTION

1. Field of the Invention

This invention relates to an integrated circuit formed upon a frontside surfaces of semiconductor substrates, and more particularly to failure analysis and fault isolation techniques employed in cases where the frontside surfaces are inaccessible, or where several layers of metal interconnects prevent the use of more conventional circuit probing techniques upon the frontside surface.

2. Description of the Relevant Art

During manufacture of an integrated circuit (e.g., a microprocessor), electronic components are formed upon and within a frontside surface of a semiconductor substrate having opposed frontside and backside surfaces. The electronic components are connected together by electrically conductive interconnect (i.e., signal) lines, forming an electronic circuit. Signal lines which are to be connected to external devices are terminated at flat metal contact regions called input/output (I/O) pads. Following manufacture, the integrated circuit (i.e., "chip") is typically secured within a protective semiconductor device package. Each I/O pad of the chip is then connected to one or more terminals of the device package. The terminals of a device package are typically arranged about the periphery of the package. The I/O pads of the chip are electrically connected to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Grid array semiconductor device packages have terminals arranged in a two-dimensional array across an underside surface of the device package. As a result, the physical dimensions of grid array device packages having hundreds of terminals are much smaller than their peripheral-terminal counterparts. Such smaller packages are highly desirable in portable device applications such as laptop and palmtop computers and handheld communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array ("BGA") device package. FIG. 1 is a cross-sectional view of an exemplary ball grid array (BGA) device 10 including an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a frontside surface of semiconductor substrate 20 during wafer fabrication. The electronic components are connected by electrically conductive interconnect lines, forming an electronic circuit. Multiple input/output (I/O pads) 24 are also formed within circuit layer 22. I/O pads 24 are typically coated with solder, forming solder "bumps" 26.

The integrated circuit is attached to the package substrate using the controlled collapse chip connection (C4® or "flip chip") method. During the C4® mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate. After integrated circuit 12 is attached to package substrate 14, the region between integrated circuit 12 and package substrate 14 is filled with an "underfill" material 28 which encapsulates the C4® connections and provides other mechanical advantages.

Package substrate 14 may be made of, for example, fiberglass-epoxy printed circuit board material or ceramic material (e.g., aluminum oxide, alumina, $Al_2O_3$, or aluminum nitride, AlN). Package substrate 14 includes one or more layers of signal lines (i.e., interconnects) which connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted to an ordinary PCB. During PCB assembly, BGA device 10 is attached to the PCB by reflow of solder balls 30 just as the integrated circuit is attached to the package substrate.

The C4® mounting of integrated circuit 12 to package substrate 14 prevents physical access to circuit layer 22 for failure analysis and fault isolation. However, several analytic and diagnostic techniques developed to reveal defects and logic states within integrated circuits are also useful when applied to flip chip grid array devices. Some of these techniques involve stimulation of a target portion of circuit layer 22 with electromagnetic radiation. For example, silicon substrates transmit a significant fraction of incident laser light having wavelengths from about 1,000 nanometers (nm) to upwards of 1,800 nm. Photons of laser light with wavelengths from about 1,000 nm to approximately 1,200 nm have sufficient energy to create electron-hole pairs in some silicon substrates used for wafer fabrication when absorbed during collisions with atoms of elements within the silicon substrates. The electrons and holes (i.e., charge carriers) thus created cause detectable changes in (i.e., stimulate) an isolated target portion of circuit layer 22. Photons of laser light having wavelengths greater than or equal to about 1,300 nm lack sufficient energy to create electron-hole pairs during collisions. However, the magnitude and/or phase of a reflected portion of an incident laser beam having a wavelength of about 1,300 or greater is affected by electric fields and charge modulation effects existing within circuit layer 22. Techniques which detect the reflected portion allow imaging within the silicon substrates.

FIG. 2 is a cross-sectional view of integrated circuit 12 of BGA device 10 of FIG. 1 undergoing such electromagnetic stimulation. A beam of laser light (i.e., an incident beam 32) having a sufficient wavelength is directed onto an upward-facing backside surface 34 of integrated circuit 12. A portion of the incident beam (i.e., a reflected portion 36) is reflected from backside surface 34, and the remainder (i.e., a transmitted portion 38) is transmitted into semiconductor substrate 20. Photons of transmitted portion 38 are absorbed within semiconductor substrate 20 during collisions with atoms of elements within semiconductor substrate 20. The electrons and holes created when the photons are absorbed near target portion 40 of circuit layer 22 stimulate the electronic components within target portion 40. Some analytic methods detect changes in the amount of electrical power delivered to integrated circuit 12 subject to such electromagnetic stimulation. For example, U.S. Pat. No. 5,430,305 describes the scanning of an incident laser beam across a backside surface of an integrated circuit and the detection of resultant changes in the voltage of a constant-current power supply delivering electrical power to the integrated circuit in order to image or "map" logic states of electronic components within the circuit layer.

When photons of transmitted portion 38 strike electronic components or encounter electric fields within target portion 40, part of transmitted portion 38 is reflected back toward backside surface 34. At the interface between semiconductor substrate 20 and the surrounding air, part of the light emanating from target portion 40 is reflected back into semiconductor substrate 20, and the remainder emerges from the backside surface as an exit beam 42. Scanning laser beam microscopes scan incident beam 32 across a surface of a specimen (e.g., semiconductor substrate 20) and detect the intensity of exit beam 42 emerging from the surface, allowing imaging of structures within the specimen.

FIG. 3 is a cross-sectional view of integrated circuit 12 of the BGA device 10 of FIG. 1 illustrating another diagnostic technique useful in revealing defects within integrated circuit 12. Electron-hole pairs present within semiconductor substrate 20 recombine at crystalline defect sites (i.e., impurities, dislocations, stacking faults, etc.) within semiconductor substrate 20. When the semiconductor material of substrate 20 is silicon, a small portion of electron-hole pairs emit a photon of light (i.e., electromagnetic radiation) when they recombine. Other types of defects such as thin metal-to-metal "filaments" also emit electromagnetic radiation.

A relatively large component of the electromagnetic radiation emitted by defects exists in the near infrared region of the electromagnetic spectrum. Defects within integrated circuit 12 may thus be located by detecting near infrared radiation (i.e., light) 46 emitted from within a portion 48 of circuit layer 22 during operation of integrated circuit 12. At the interface between semiconductor substrate 20 and the surrounding air, a portion of the emitted light is reflected back into semiconductor substrate 20, and the remainder emerges from backside surface 34 as an exit beam 50. Detection of exit beam 50 allows the locations of certain types of defects within the semiconductor substrate 20 to be determined. Emission microscopes employ this technique.

Several problems arise when employing the above analytic and diagnostic techniques which rely upon either electromagnetic stimulation of electronic components within circuit layer 22 (FIG. 2) or the detection of light emitted at defect sites within circuit layer 22 (FIG. 3). In FIG. 2, a large fraction of incident beam 32 is reflected at backside surface 34 (i.e., the intensity of reflected portion 36 is a substantial portion of the intensity of incident beam 32). As a result, the intensity of transmitted portion 38 is relatively low, reducing the level of stimulation of electronic components within target portion 40 of circuit layer 22. Due to the low level of stimulation, the responses from electronic components within target portion 40 have low magnitudes. Such low magnitude responses may be difficult to detect over background "noise" levels, reducing the resolutions of scanned images. In addition, where detection of exit beam 42 is relied upon to create a scanned image, reflected portion 36 and stray exit beams (e.g., stray exit beam 44) caused by reflections within semiconductor substrate 20 represent substantial background noise levels. In FIG. 3, stray exit beams (e.g., stray exit beam 52) also contribute to the background noise level which makes detection of relatively low light levels emanating from within portion 48 of circuit layer 22 difficult and reduces the resolutions of scanned images.

It would be beneficial to have various methods for analyzing an integrated circuit from the backside surface which employ measures to reduce: (i) the large fraction of an incident beam reflected from the backside surface when the incident beam strikes the backside surface, and/or (ii) stray exit beams caused by reflections within the semiconductor substrate. Reducing such reflections would lower background noise levels, thereby increasing the detection capabilities of the methods and the resolutions of resulting scanned images.

SUMMARY OF THE INVENTION

The problems outlined above are in large part solved by various methods described herein for analyzing an electronic circuit formed upon a frontside surface of a semiconductor substrate having opposed frontside and backside surfaces. Each method includes forming a layer of an antireflective coating material upon the backside surface of the substrate prior to detecting electromagnetic radiation emanating from the backside surface. The layer of an antireflective coating material reduces reflections which contribute to background noise levels. As a result of reduced background noise levels, the detection capabilities of the methods and the resolutions of any scanned images produced using the methods are improved.

A first method includes forming a layer of an antireflective coating material upon the backside surface of the substrate, directing a beam of electromagnetic radiation toward the backside surface of the substrate, and detecting a response from the electronic circuit. The beam of electromagnetic radiation includes a component having a wavelength at which the substrate is substantially transparent. The component may be, for example, laser light. The antireflective coating material may be lead fluoride ($PbF_2$) having an index of refraction between that of the surrounding air and silicon, silicon being the most common semiconductor substrate material used today. When the thickness of the layer of $PbF_2$ is substantially one quarter of the wavelength of the laser light within the layer of $PbF_2$, the layer of $PbF_2$ acquires antireflective properties. The layer of $PbF_2$ reduces the intensity of laser light reflected at its boundaries, thereby increasing the intensity of laser light transmitted therethrough.

The first method may also include supplying electrical voltage and current to the electronic circuit such that the electronic circuit is operational during the directing step. The magnitude of the electrical current may be held constant, while the magnitude of the electrical voltage is allowed to vary in order to maintain the constant electrical current. Photons of the laser light may have sufficient energy to create electron-hole pairs (i.e., excess charge carriers) within the semiconductor substrate when absorbed. The absorbtion of photons of the laser light near the frontside surface of the semiconductor substrate creates excess charge carriers which stimulate the electronic circuit. The excess charge carriers are swept up into any electric fields existing within the electronic circuit. Electric fields exist, for example, between source and drain regions of metal oxide semiconductor (MOS) transistors. The excess charge carriers cause the amount of electrical power dissipated by the electronic circuit to fluctuate. The resulting change in the magnitude of the electrical voltage represents a response of the electronic circuit to the stimulation provided by the laser light.

The beam of laser light may be directed toward the backside surface of the substrate (i.e., the upper surface of the layer of antireflective coating material) such that only a selected portion of the electronic circuit is illuminated by the beam of laser light. A resulting variance in the magnitude of the voltage produced by the power supply constitutes a response of the selected portion of the electronic circuit, and may be recorded. The magnitude of the variance in the voltage produced by the power supply is dependent upon the presence of an electric field within the selected portion. A scanning procedure may be used to determine the responses for all portions of the electronic circuit, and a two-dimensional image may be created from the scan data. The two-dimensional image may reveal the locations of electric fields within the electronic circuit.

A second method includes the forming of the layer of an antireflective coating material upon the backside surface of the substrate, directing the beam of electromagnetic radiation toward the backside surface of the substrate, and detecting a portion of the beam of electromagnetic radiation reflected by the electronic circuit. As in the first method, the electromagnetic radiation may be laser light, and electrical power may be supplied to the electronic circuit such that the electronic circuit is operational during the directing step. The detector is positioned above the backside surface of the substrate, and is used to detect the intensity of laser light reflected from electronic components of the electronic circuit (e.g., metal interconnect lines) and emerging from the backside surface. The presence of an electric field within the substrate changes the index of refraction of the portion of the substrate enveloped by the field. As the index of refraction of a substance determines how much light is reflected from the substance, the intensity of the reflected laser light may also be dependent upon the presence or absence of any electric fields within the electronic circuit.

In the second method, the beam of laser light may be produced such that it has a known intensity. The beam of laser light may be directed toward the backside surface of the substrate such that a selected portion of the electronic circuit is illuminated by the beam of laser light. The intensity of the portion of the beam of laser light reflected by the selected portion of the electronic circuit may be measured, and a ratio of the intensity of the reflected portion to the known intensity of the incident beam of laser light may be calculated. The ratio represents the magnitude of the response of the electronic circuit to the stimulation provided by the laser light. As in the first method, a scanning procedure may be used to determine the responses for all portions of the electronic circuit, and a two-dimensional image may be created from the scan data. The two-dimensional image may reveal the locations of electronic components within the electronic circuit. The two-dimensional image may also reveal the locations of electric fields within the electronic circuit.

A third method of the present invention includes forming the layer of antireflective coating material upon the backside surface of the substrate, supplying electrical power to the electronic circuit such that defects within the electronic circuit emit electromagnetic radiation, and detecting a portion of the electromagnetic radiation exiting the semiconductor substrate through the backside surface. Many types of defects within the electronic circuit formed upon the frontside surface of the semiconductor substrate emit electromagnetic radiation in the near infrared region. A detector may be positioned above the backside surface of the substrate and configured to detect the portion of the near infrared radiation exiting through the backside surface. Correspondingly, the thickness of a layer of $PbF_2$ formed upon the backside surface of the substrate may be substantially equal to one quarter of the wavelength of near infrared radiation within the layer of $PbF_2$. The intensity of the near infrared radiation exiting through the backside surface may be dependent upon the presence or absence of any defects within the electronic circuit.

The detector may be configured to receive near infrared radiation emitted by a portion of the electronic circuit. In this case, an array of detectors may be used to determine the amounts of near infrared radiation emitted by all portions of the electronic circuit within a field of view of the objective, and a two-dimensional image may be created from the data gathered by the array. The two-dimensional image may reveal the locations of defects within the electronic circuit.

All of the above methods may be enhanced by the removal of material from the backside surface of the semiconductor substrate prior to the forming of the layer of antireflective coating material. Such "thinning" of the semiconductor substrate reduces the amount of substrate material through which the electromagnetic radiation must pass, decreasing the fraction of the electromagnetic radiation which may be scattered or absorbed within the bulk of the semiconductor substrate. Material may be removed from the backside surface of the semiconductor substrate by, for example, focusing a high power laser beam upon the backside surface (i.e., laser ablation). Alternately, a mechanical grinding or polishing process may be used to remove material from the backside surface of the substrate.

BRIEF DESCRIPTION OF THE DRAWINGS

Other objects and advantages of the invention will become apparent upon reading the following detailed description and upon reference to the accompanying drawings in which.

Figure 1:
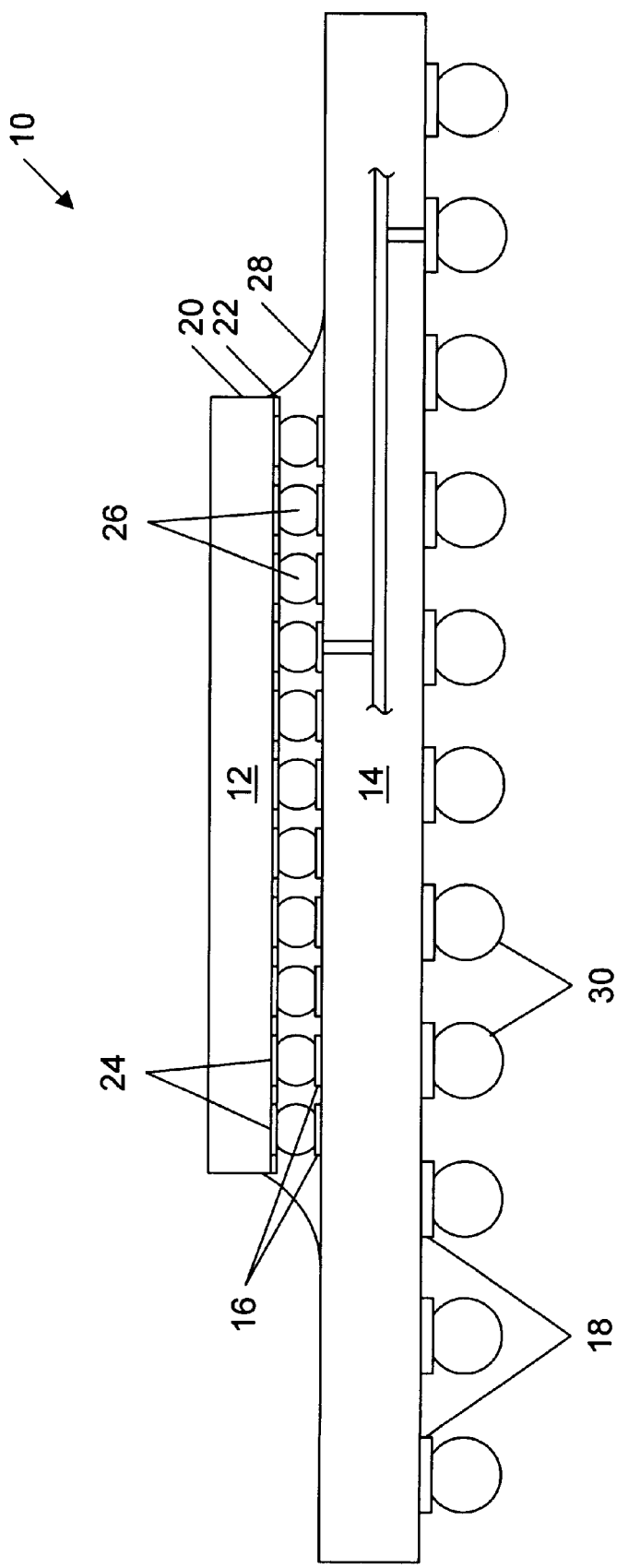
FIG. 1 is a cross-sectional view of an exemplary ball grid array (BGA) device including an integrated circuit mounted upon a larger package substrate, wherein an electronic circuit is formed upon a frontside surface of a semiconductor substrate of the integrated circuit, and wherein the frontside surface of the semiconductor substrate is connected to the package substrate such that the frontside surface is inaccessible with conventional circuit probing techniques.
Figure 2:
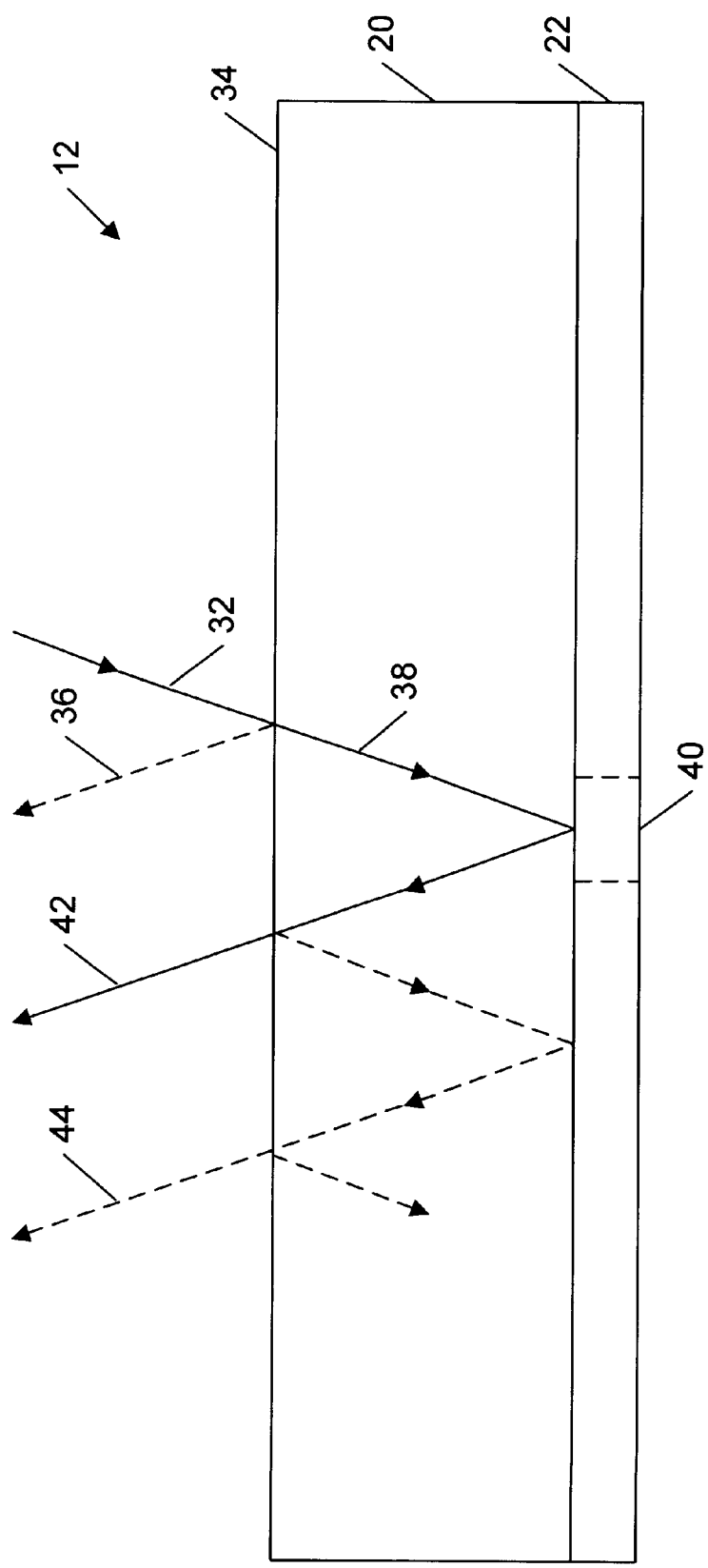
FIG. 2 is a cross-sectional view of the integrated circuit of the BGA device of FIG. 1 undergoing a first known analysis technique, wherein an upward-facing backside surface of the semiconductor substrate of the integrated circuit is subjected to a beam of laser light directed onto the backside surface.
Figure 3:
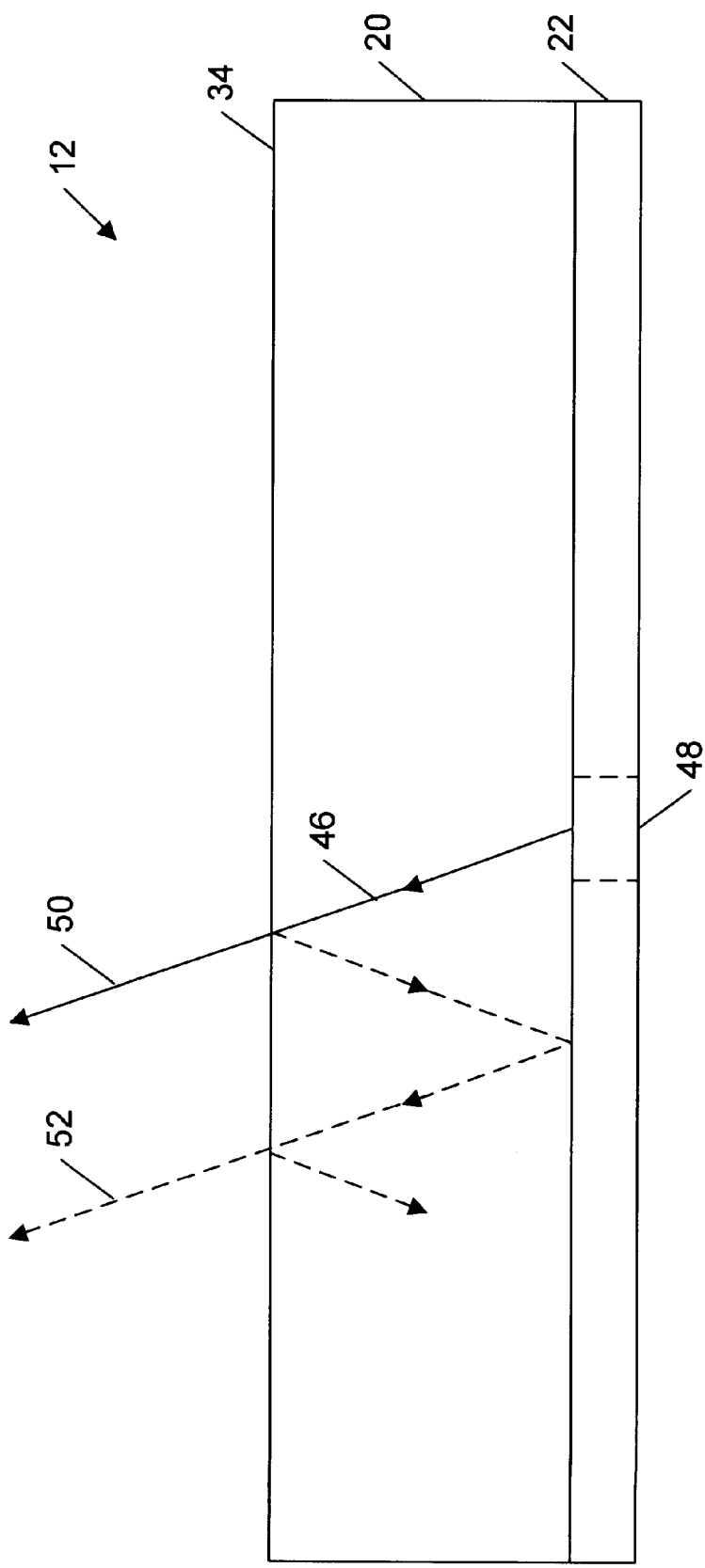
FIG. 3 is a cross-sectional view of the integrated circuit of the BGA device of FIG. 1 undergoing a second known analysis technique, wherein electron-hole pairs present within the semiconductor substrate recombine at crystalline defect sites within the semiconductor substrate, and wherein a small portion of the electron-hole pairs emit a photon of near infrared radiation when they recombine, and wherein a fraction of the near infrared radiation exits the backside surface of the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims, for example dual layer coatings and/or v-layers known to those skilled in antireflective coatings and optics technologies.

DETAILED DESCRIPTION OF THE PREFERRED EMBODIMENTS

FIGS. 4–7 will now be used to describe various methods for analyzing an electronic circuit embodied within an integrated circuit 54 in accordance with the present invention. Integrated circuit 54 includes a semiconductor substrate 56 having opposed frontside and backside surfaces. Multiple electronic components, formed during a wafer fabrication process, exist within a circuit layer 58 upon the frontside surface of semiconductor substrate 56.

It is noted that integrated circuit 54 may or may not be separated from the semiconductor wafer upon which it is formed prior to analysis, and may or may not be secured within a protective semiconductor device package prior to analysis. Common semiconductor device packages include BGA device packages described above, pin grid array (PGA) packages, dual in-line (DIP) packages, and quad flatpack packages.

Figure 4:
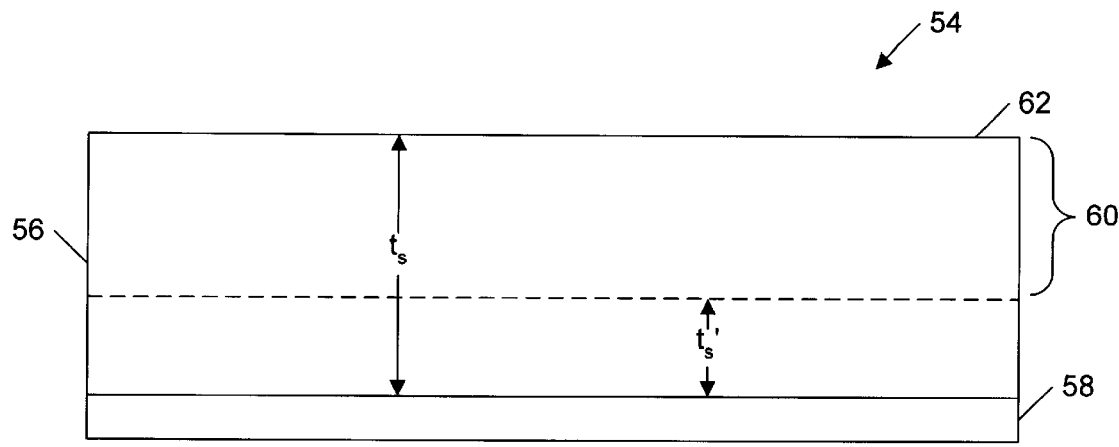
FIG. 4 is a cross-sectional view of a semiconductor substrate undergoing analysis in accordance with the present invention.
Figure 5:
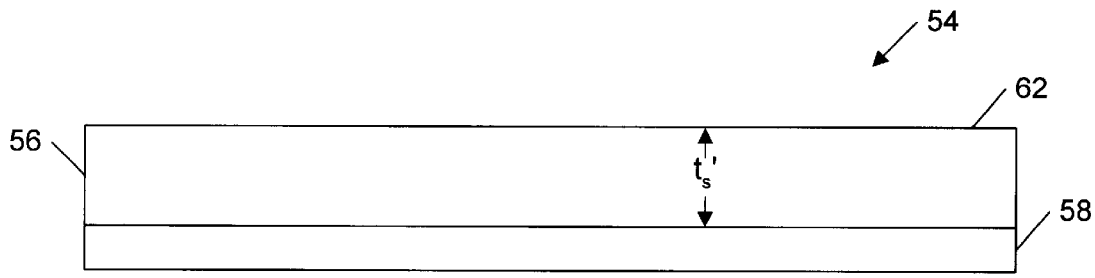
FIG. 5 is a cross-sectional view of the semiconductor substrate of FIG. 4 following removal of a portion of the semiconductor substrate from the backside surface.
Figure 6:
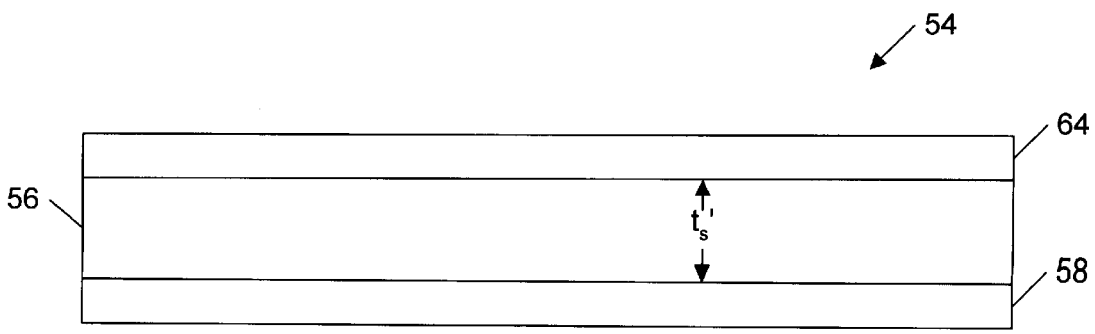
FIG. 6 is a cross-sectional view of the semiconductor substrate of FIG. 4 following application of a layer of an antireflective coating material in accordance with the present invention.

FIGS. 4–6 illustrate steps which may be used to prepare integrated circuit 54 for analysis. FIG. 4 is a cross-sectional view of semiconductor substrate 56 prior to removal of a portion 60 of semiconductor substrate 56 from backside surface 34. Such "thinning" of semiconductor substrate 56 reduces the amount of substrate material through which electromagnetic radiation must pass, decreasing the fraction of the electromagnetic radiation which may be scattered or absorbed within the bulk of semiconductor substrate 56. Portion 60 may be removed by focusing a high power laser beam upon backside surface 62 (i.e., by laser ablation). Alternately, portion 60 may be removed using an etching process (e.g., chemical or ion etching), mechanical grinding, mechanical polishing, or chemical-mechanical polishing. In this manner, semiconductor substrate 56 may be "thinned" from a starting thickness $t_S$ to a final thickness $t_S'$.

FIG. 5 is a cross-sectional view of semiconductor substrate 56 following removal of portion 60 of semiconductor substrate 56 from backside surface 62. The value of final thickness $t_S'$ is selected such that semiconductor substrate 56 maintains structural integrity during handling and a substantially planar shape. Starting thickness $t_S$ may be, for example, about 700 microns (700 $\mu$), and final thickness $t_S'$ may be, for example, between 80 $\mu$ and 125 $\mu$.

Following any thinning of semiconductor substrate 56, a layer of an antireflective coating material 64 is applied to backside surface 62 of semiconductor substrate 56. FIG. 6 is a cross-sectional view of semiconductor substrate 56 following application of the layer of antireflective coating material 64. The layer of antireflective coating material 64 will be described in detail below.

The layer of antireflective coating material 64 may be formed using electron beam physical vapor deposition (EB-PVD). During such a process, semiconductor substrate 56 may be placed within an evacuated chamber, and electron beams may be directed at one or more containers of the coating material located within the chamber. The electron beams may melt and evaporate the coating material, forming the layer of antireflective coating material 64 upon the backside surface of semiconductor substrate 56. Alternately, the layer of antireflective coating material 64 may be formed using any of various spin coating, spray coating, chemical vapor deposition, or other physical vapor deposition techniques.

Figure 7:
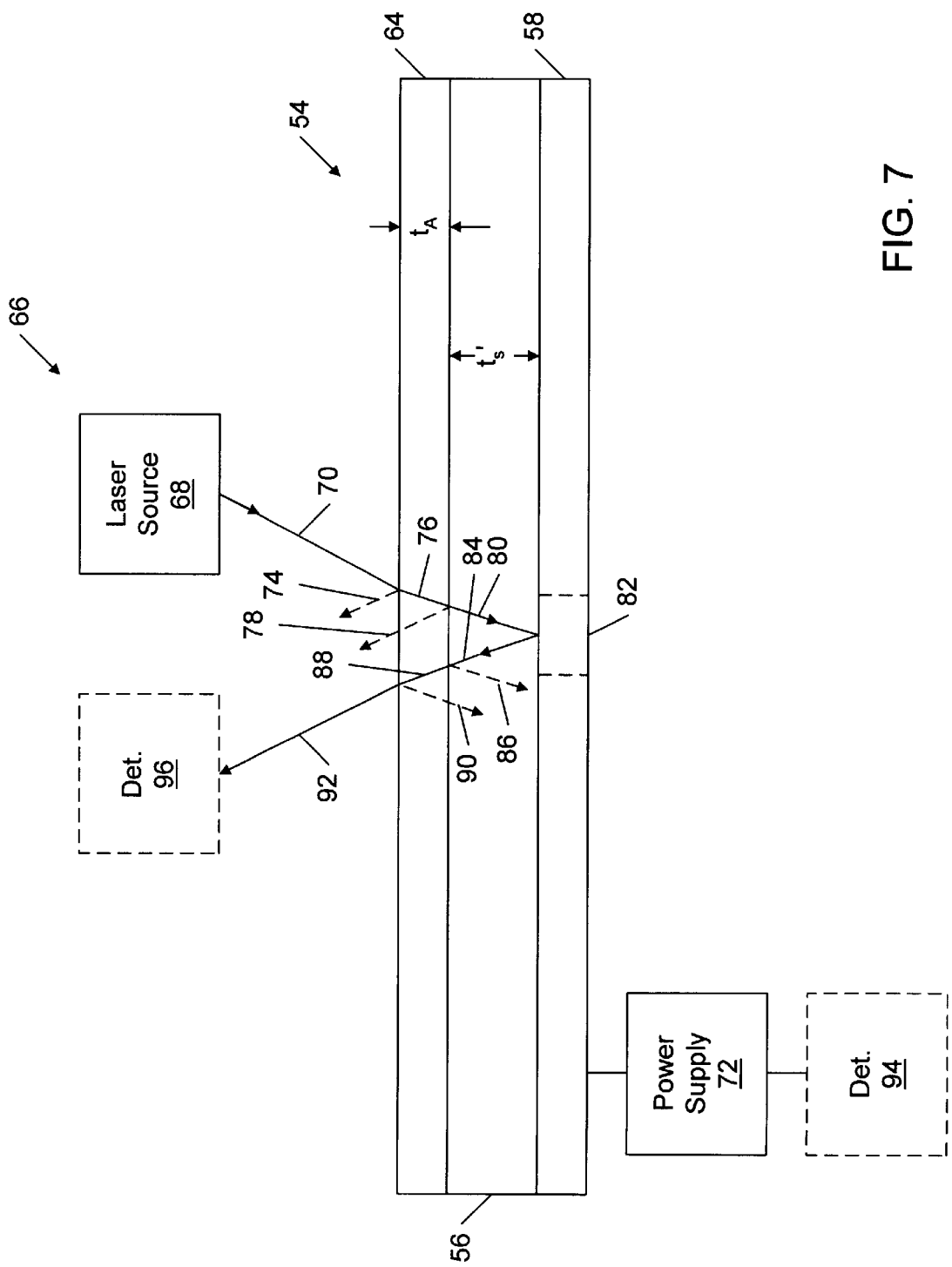
FIG. 7 is a cross-sectional view of the semiconductor substrate of FIG. 4 undergoing analysis in accordance with a first and second methods of the present invention.

FIG. 7 is a cross-sectional view of semiconductor substrate 56 undergoing analysis in accordance with a first and second methods of the present invention. The desired characteristics and benefits of the layer of antireflective coating material 64 will be described first, following by descriptions of the first and second methods. When implementing at least one method, an apparatus 66 includes a laser source 68 which produces electromagnetic radiation in the form of, for example, a beam of laser light. The beam of laser light may be directed toward the backside surface of semiconductor substrate 56, creating an incident beam 70 which strikes an upper surface of the layer of antireflective coating material 64. A power supply 72 may be coupled to the electronic circuit within circuit layer 58, and power supply 72 may supply electrical power to the electronic circuit during analysis. According to one example, power supply 72 is connected to a conductor or electronic component within circuit layer 58. The conductor and/or component is configured to respond to incident beam 70.

When incident beam 70 strikes an upper surface of the layer of antireflective coating material 64, a portion of incident beam 70 (i.e., a first reflected portion 74) is reflected from the upper surface, and the remainder (i.e., a first transmitted portion 76) is transmitted into the layer of antireflective coating material 64. The sum of the intensities of first reflected portion 74 and first transmitted portion 76 is equal to the intensity of incident beam 70. The index of refraction of the layer of antireflective coating material 64 is greater than that of the surrounding air, and first reflected portion 74 undergoes a 180 degree phase shift upon reflection from the upper surface of the layer of antireflective coating material 64.

When first transmitted portion 76 strikes the upward-facing backside surface of semiconductor substrate 56, a second reflected portion 78 is reflected from the backside surface, and the remaining second transmitted portion 80 is transmitted into semiconductor substrate 56. As before, the sum of the intensities of second reflected portion 78 and second transmitted portion 80 is equal to the intensity of first transmitted portion 76. The index of refraction of semiconductor substrate 56 is greater than that of the layer of antireflective coating material 64, and second reflected portion 78 undergoes a 180 degree phase shift upon reflection from the backside surface of semiconductor substrate 56.

The thickness "$t_A$" of the layer of antireflective coating material 64 is preferably selected such that it is one-fourth the wavelength of the laser light within the antireflective coating. In this case, when second reflected portion 78 arrives at the upper surface of the layer of antireflective coating material 64, it has traveled half a wavelength farther than first reflected portion 74. First reflected portion 74 and second reflected portion 78 are thus 180 degrees out of phase, resulting in total destructive interference such that first reflected portion 74 and second reflected portion 78 cancel each other out at the upper surface of the layer of antireflective coating material 64. Thus no laser light is reflected from the upper surface of the layer of antireflective coating material 64 into the surrounding air.

When photons of second transmitted portion 80 strike electronic components and/or encounter electric fields within a target portion 82 of circuit layer 58, a fraction of second transmitted portion 80 (i.e., a third reflected portion 84) is reflected back toward the backside surface of semiconductor substrate 56. At the interface between semiconductor substrate 56 and the layer of antireflective coating material 64, part of third reflected portion 84 is reflected back into semiconductor substrate 56 (i.e., a fourth reflected portion 86), and the remainder (i.e., a third transmitted portion 88) is transmitted into the layer of antireflective coating material 64. As the index of refraction of the layer of antireflective coating material 64 is less than that of semiconductor substrate 56, fourth reflected portion 86 undergoes no phase shift upon reflection from the underside surface of the layer of antireflective coating material 64.

At the interface between the layer of antireflective coating material 64 and the surrounding air, part of third transmitted portion 88 is reflected back into the layer of antireflective coating material 64 (i.e., a fifth reflected portion 90), and the remainder emerges from the upper surface of the layer of antireflective coating material 64 as an exit beam 92. As the index of refraction of the surrounding air is less than that of the layer of antireflective coating material 64, fifth reflected portion 90 undergoes no phase shift upon reflection from the upper surface of the layer of antireflective coating material 64.

Again, the thickness $t_A$ of the layer of antireflective coating material 64 is preferably selected such that it is one-fourth the wavelength of the laser light within the antireflective coating. In this case, when fifth reflected portion 90 arrives at the underside surface of the layer of antireflective coating material 64, it has traveled half a wavelength farther than fourth reflected portion 86. Fourth reflected portion 86 and fifth reflected portion 90 are thus 180 degrees out of phase, resulting in total destructive interference such that fourth reflected portion 86 and fifth reflected portion 90 cancel each other out at the underside surface of the layer of antireflective coating material 64. Thus no laser light is reflected from the underside surface of the layer of antireflective coating material 64 into semiconductor substrate 56.

When implementing the first method of the present invention, apparatus 66 includes laser source 68 and a detector 94. Photons of the laser light produced by laser source 68 may have sufficient energy levels to create electron-hole pairs (i.e., excess charge carriers) when absorbed during collisions with atoms of elements within semiconductor substrate 56. The excess charge carriers created when photons of second transmitted portion 80 are absorbed near target portion 82 stimulate electronic components within the electronic circuit. The excess charge carriers are swept up into any electric fields existing within target portion 82. Such electric fields exist, for example, between source and drain regions of metal oxide semiconductor (MOS) transistors. Such stimulation causes changes in the amount of electrical power drawn by the electronic circuit within circuit layer 58.

Power supply 72 may be, for example, a power supply having a constant-voltage operating mode and a constant-current operating mode. In the constant-voltage operating mode, the output current of power supply 72 varies in order to keep the output voltage constant. In the constant-current operating mode, the output voltage of power supply 72 varies in order to keep the output current constant. Detector 94 is coupled to power supply 72 and detects changes in the output voltage. During analysis, such changes in the output voltage while power supply 72 is operating in the constant-current mode represent responses of the electronic circuit to the stimulation provided by the portion of incident beam 70 reaching target portion 82.

During the first method, power supply 72 is placed in the constant-voltage mode, and the output voltage is set to meet the requirements of the electronic circuit formed within circuit layer 58. A desired operating state of the electronic circuit is then established and maintained. For example, when the electronic circuit is a digital electronic circuit, the electronic circuit may be "halted" in a desired operating state. The operating mode of power supply 72 is then switched from the constant-voltage mode to the constant-current mode. Incident beam 70 is directed toward the backside surface of semiconductor substrate 56 (i.e., the upper surface of the layer of antireflective coating material 64) such that target portion 82 is illuminated, and a magnitude of the variance in the voltage produced by power supply 72 is recorded. The response of target portion 82 to illumination by incident beam 70 is believed to be variable and predominately represented as a variance in the voltage produced by power supply 72 while operating in the constant-current mode as described in U.S. Pat. No. 5,430,305 (incorporated herein by reference). The magnitude of the response is believed to be dependent upon the presence of an electric field within target portion 82.

Incident beam 70 may be scanned across the backside surface of semiconductor substrate 56 such that responses are obtained for all portions of the electronic circuit. A two-dimensional image may then be created from the scan data which reveals the locations of electric fields within the electronic circuit.

When implementing the second method of the present invention, apparatus 66 includes laser source 68 and a detector 96. Detector 96 is positioned above the backside surface of semiconductor substrate 56, and detects laser light reflected from the electronic components (e.g., metal interconnect lines) within target portion 82 and exiting the backside surface. Additionally, the presence of an electric field within target portion 82 changes the index of refraction of the portion of semiconductor substrate 56 enveloped by the field. As the index of refraction of a substance determines how much light is reflected from the substance, the intensities of third reflected portion 84 and exit beam 92 may also be dependent upon the presence or absence of any electric fields within target portion 82.

Incident beam 70 may be produced such that it has a known intensity, and detector 96 may be used to measure the intensity of exit beam 92. A ratio of the intensity of exit beam 92 to the known intensity of incident beam 70 may be calculated. The ratio represents the magnitude of the response of target portion 82 to the stimulation provided by incident beam 70.

Incident beam 70 may be scanned across the backside surface of semiconductor substrate 56, and detector 96 may be used to detect the varying intensity of exit beam 92 emerging from the backside surface of semiconductor substrate 56. The resulting scan data may be used to create a two-dimensional image of the electronic components within circuit layer 58. The intensity of exit beam 92 may also be dependent upon the presence or absence of any electric fields within target portion 82.

The index of refraction of the material making up the layer of antireflective coating material 64 is preferably chosen to be between the indices of refraction of the surrounding air and semiconductor substrate 56. In this case, the intensity of second transmitted portion 80 is increased. The resulting increased stimulation of electronic components within target portion 82 in turn increases the magnitudes of the responses of the electronic components. Such higher-magnitude responses are more easily detected over background noise levels, and the resolutions of images produced from the responses are increased. In addition, the thickness $t_A$ of the layer of antireflective coating material 64 is selected such that no laser light is reflected from the underside surface of the layer of antireflective coating material 64 into semiconductor substrate 56. Such reflected laser light may stimulate other portions of circuit layer 58, increasing the background noise level and decreasing the detection capabilities of the methods and the resolutions of produced images.

For example, the methods described herein may be performed with integrated circuit 54 surrounded by air. The index of refraction of air is 1.0, and the index of refraction of silicon is approximately 3.49. When semiconductor substrate 56 is substantially made of silicon, a material for the layer of antireflective coating material 64 is selected having an index of refraction between 1.0 and 3.49, and preferably as close as possible to the square root of the product of 1.0 and 3.49, or 1.86. The material for the layer of antireflective coating material 64 may be selected to be, for example, lead fluoride ($PbF_2$) having an index of refraction of about 1.8.

Laser source 68 may be, for example, a neodymium:yttrium-aluminum-garnet (Nd:YAG) laser producing laser light having a wavelength of about 1,064 nm in air. Again, the thickness $t_A$ of the antireflective coating is selected such that it is one-fourth the wavelength of the laser light within the layer of antireflective coating material 64. The wavelength of the laser light in $PbF_2$ is approximately 1,064 nm·(1.0/1.8)=591.1 nm. The thickness $t_A$ of the antireflective coating is preferably about one-fourth of 591.1 nm, or approximately 147.8 nm.

Detection and measurement of several electro-optic effects are significantly improved by the layer of antireflective coating material 64, including charge sensing, d.c.-induced second harmonic probe, photoexcitation probe, Kerr effect, and the Franz Keldysh effect. Charge sensing and the Franz Keldysh effect are of particular interest. The charge sensing or charge modulation effect involves a perturbation in the index of refraction by free charge carriers (i.e., current within circuit layer 58). A change in the index of refraction within target portion 82 results in changes in the intensities of third reflected portion 84 and exit beam 92. The change in the index of refraction is directly proportional to the concentration of free charge carriers (i.e., the carrier concentration). Alternating voltages within circuit layer 58 (e.g., transistor switching) causes the free charge carriers to move, changing the localized carrier concentrations and resulting in localized changes in the index of refraction within semiconductor substrate 56. It is noted that the creation of free charge carriers (i.e., electron-hole pairs) is not required, and laser light having a wavelength between about 1,300 nm and approximately 1,800 nm may be used. The resulting relatively small fluctuations in the intensity of exit beam 92 are difficult to measure. The layer of antireflective coating material 64 transmits a fraction of third reflected portion 84 which would otherwise be reflected into semiconductor substrate 56, producing an increased intensity of exit beam 92. As a result, the amount of time target portion 82 must be illuminated is reduced, thereby reducing the total amount of background noise acquired by detector 96. The signal-to-noise ratio is improved, as is the resolution of the resultant image.

The Franz-Keldysh effect is an electric field (i.e., voltage) induced shift in the bandgap of semiconductor substrate 56. This shift in the bandgap increases the probability of charge carriers tunneling from the valence band to the conduction band. As with the charge sensing technique, the creation of free charge carriers (i.e., electron-hole pairs) is not required. The energy levels of the laser light photons must be near the bandgap energy of the semiconductor material. In the case of silicon, laser light produced by an Nd:YAG laser and having a wavelength of about 1,064 nm is suitable for detecting the Franz-Keldysh effect. As the bandgap shifts with the voltage applied to circuit layer 58, the fraction of photons absorbed within semiconductor substrate 56 changes, causing fluctuations in the intensities of third reflected portion 84 and exit beam 92. Again, the resulting relatively small fluctuations in the intensity of exit beam 92 are difficult to measure. As described above, the layer of antireflective coating material 64 transmits a fraction of third reflected portion 84 which would otherwise be reflected into semiconductor substrate 56, producing an increased intensity of exit beam 92. As a result, the amount of time target portion 82 must be illuminated is reduced, thereby reducing the total amount of background noise acquired by detector 96. The signal-to-noise ratio is improved, as is the resolution of the resultant image.

Figure 8:
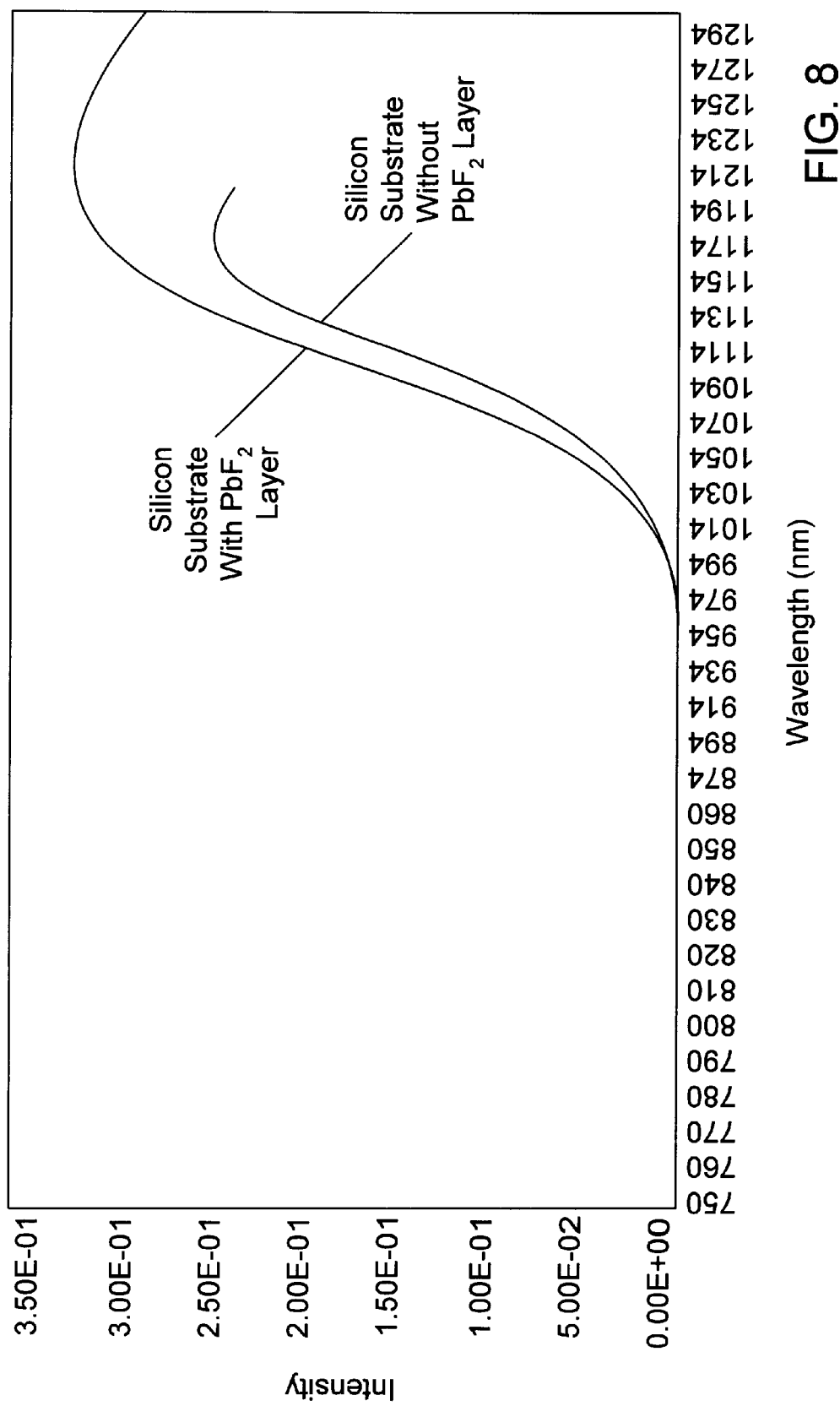
FIG. 8 is a graph of the intensity of a beam of light passing through a silicon substrate with and without an antireflective layer of $PbF_2$ versus the wavelength of the incident beam.

FIG. 8 is a graph of the intensity of light passing through a silicon substrate with and without a layer of $PbF_2$ about 148 nm thick versus the wavelength of an incident beam of light. The layer of PbF$_2$ about 148 nm thick was formed upon a first portion of the silicon substrate, and a second portion of the silicon substrate was absent the layer of PbF$_2$. With and without the layer of PbF$_2$, the silicon substrate transmits a significant portion of the incident light at wavelengths between about 1,000 nm and approximately 1,800 nm. At wavelengths between about 1,040 nm and approximately 1,300 nm, the layer of PbF$_2$ provides a significant increase in the intensity of light passing through the silicon substrate, and the silicon substrate is substantially transparent to the incident light. For all wavelengths shown, the first portion of the silicon substrate with the layer of PbF$_2$ transmits more of the incident light than the second portion without the layer of PbF$_2$. A maximum intensity of light passing through the silicon substrate occurs at a wavelength of approximately 1,064 nm. At the 1,064 nm wavelength, the first portion of the silicon substrate having the layer of PbF$_2$ transmits over 97 percent of incident light.

Thus when semiconductor substrate 56 is substantially made of silicon, the wavelength of the light produced by laser source 68 is preferably between 1,000 and 1,880 nm, and even more preferably between 1,040 nm and 1,300 nm, such that semiconductor substrate 56 transmits a significant portion of the incident beam.

Figure 9:
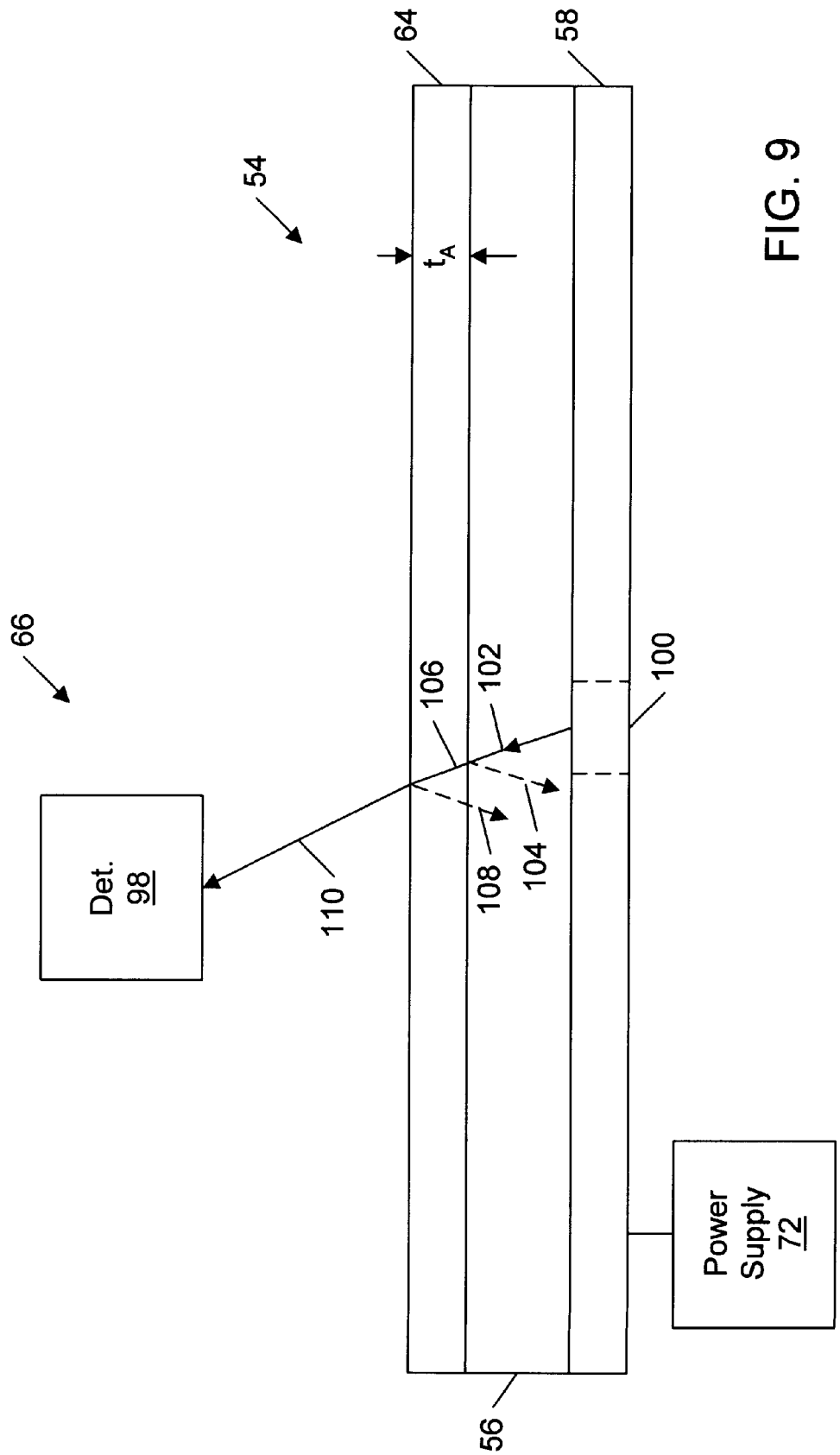
FIG. 9 is a cross-sectional view of the semiconductor substrate of FIG. 4 undergoing analysis in accordance with a third method of the present invention.

FIG. 9 is a cross-sectional view of semiconductor substrate 56 undergoing analysis in accordance with a third method of the present invention. When implementing the third method, apparatus 66 includes power supply 72 and a detector 98. Electron-hole pairs present within silicon substrate 56 recombine at crystalline defect sites (i.e., impurities, dislocations, stacking faults, etc.) as described above. When semiconductor substrate 56 is substantially made of silicon, a small portion of these electron-hole pairs emit a photon of light (i.e., electromagnetic radiation) when they recombine. As mentioned above, other types of defects within circuit layer 58 also emit electromagnetic radiation. These other types of defects include switching transistors, leaky transistors, gate oxide ruptures, P-N junction damage, thin metal or polysilicon "filaments", CMOS transistors in a latchup condition, and P-N junctions in forward or reverse breakdown. A significant fraction of this electromagnetic radiation exists within the near infrared region. Detector 98 is positioned above a portion 100 of circuit layer 58 and configured to detect near infrared radiation emanating from portion 100 of circuit layer 58 and exiting the backside surface of semiconductor substrate 56.

Defects within portion 100 of circuit layer 58 create an emitted beam 102 including near infrared radiation and directed toward the backside surface of semiconductor substrate 56. At the interface between semiconductor substrate 56 and the layer of antireflective coating material 64, part of the emitted beam (i.e., a first reflected portion 104) is reflected back into semiconductor substrate 56, and the remainder (i.e., a transmitted portion 106) is transmitted into the layer of antireflective coating material 64. At the interface between the layer of antireflective coating material 64 and the surrounding air, part of transmitted portion 106 (i.e., a second reflected portion 108) is reflected back into the layer of antireflective coating material 64, and the remainder emerges from the upper surface of the layer of antireflective coating material 64 as an exit beam 110.

In this case, the thickness $t_A$ of the layer of antireflective coating material 64 is preferably selected such that it is one-fourth the wavelength of the near infrared radiation within the layer of antireflective coating material 64. When second reflected portion 108 arrives at the underside surface of the layer of antireflective coating material 64, it has traveled half a wavelength farther than first reflected portion 104. First reflected portion 104 and second reflected portion 108 are thus 188 degrees out of phase, resulting in total destructive interference such that the first and second reflected portions cancel each other out at the underside surface of the layer of antireflective coating material 64. Thus no near infrared radiation is reflected from the underside surface of the layer of antireflective coating material 64 into semiconductor substrate 56.

Detector 98 preferably includes an array of detection elements laterally adjacent to one another. Each detection element detects the intensity of near infrared radiation within a corresponding exit beam 110 emerging from the upper surface of the layer of antireflective coating material 64. Output signals produced by the detection elements may be used to create a two-dimensional image (i.e., a "map") of defect sites within circuit layer 58. Again, the thickness $t_A$ of the antireflective coating is preferably selected such that no near infrared radiation is reflected from the underside surface of the layer of antireflective coating material 64 into semiconductor substrate 56. Portions of such reflected radiation may reflect from circuit layer 58 and emerge from the upper surface of the layer of antireflective coating material 64 as stray exit beams. Such stray exit beams may be detected by detector 98, decreasing the detection capability of the method and the resolutions of resultant scanned images by increasing background noise levels.

The layer of antireflective coating material 64 transmits a portion of emitted beam 102 which would otherwise be reflected into semiconductor substrate 56, producing an increased intensity of exit beam 110. As a result, the amount of time detector 98 is used to detect near infrared radiation emerging from the upper surface semiconductor substrate 56 is reduced, thereby reducing the total amount of background noise acquired. As a result, the signal-to-noise ratio is improved, as is the resolution of the resultant image.

Figure 10:
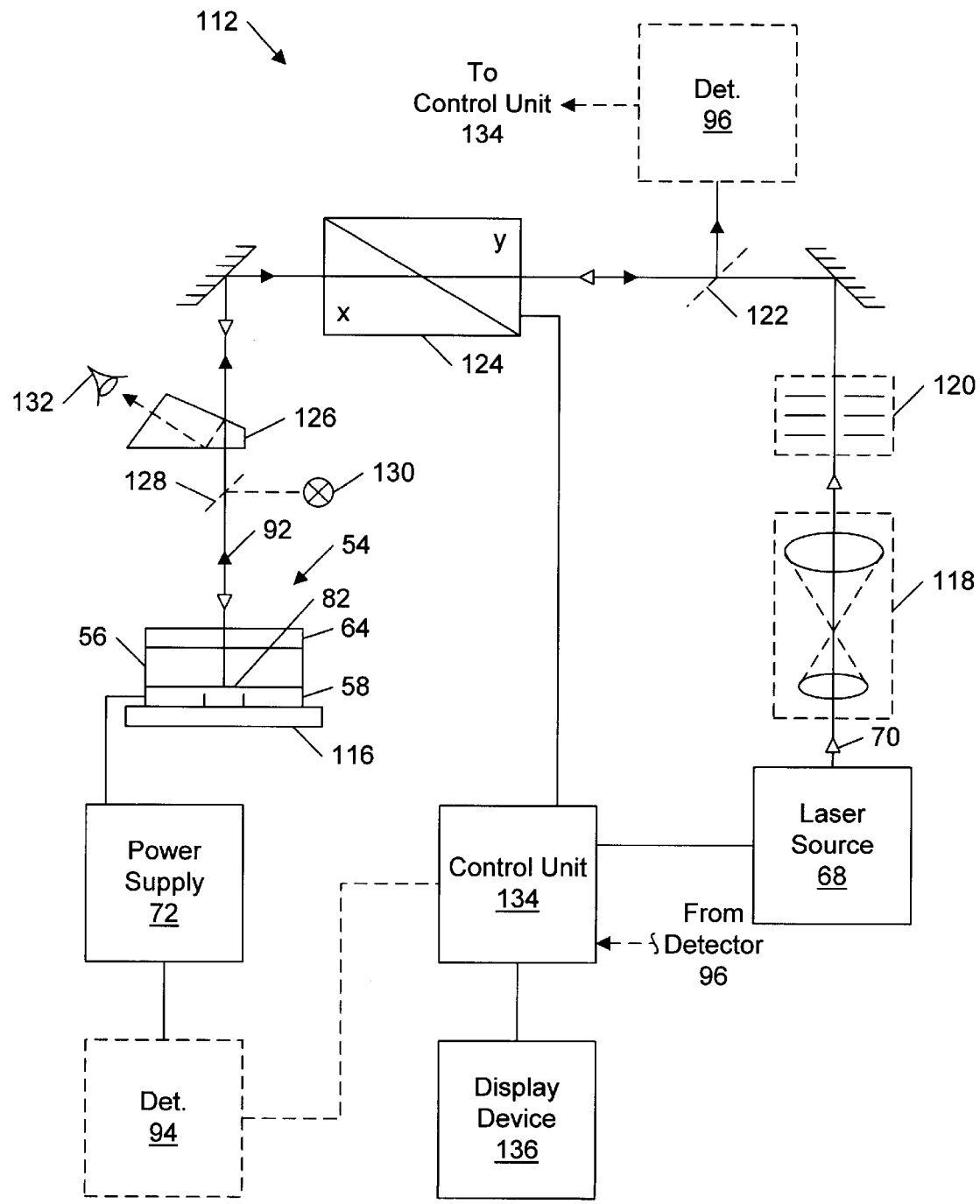
FIG. 10 is a block diagram of one embodiment of an apparatus for implementing the present first and second analysis methods.

FIG. 10 is a block diagram of one embodiment of an apparatus 112 for implementing the circuit analysis techniques illustrated in FIG. 7. Semiconductor substrate 56 is positioned upon a holder 116 such that the backside surface of semiconductor substrate 56 (covered by the layer of antireflective coating material 64) is exposed for analysis. Laser source 68 of apparatus 112 produces incident beam 70 as described above. Incident beam 70 passes through beam expansion optics 118 which control the cross-sectional area (i.e., width) of incident beam 70, determining the illuminated area or "spot size" upon the backside surface of semiconductor substrate 56 (i.e., the upper surface of the layer of antireflective coating material 64). Incident beam 70 then passes through an attenuating filter 120 which controls the intensity of incident beam 70. Attenuating filter 120 operates such that incident beam 70 is given a predetermined intensity. Apparatus 112 may also include a first beam splitter 122 and detector 96. Alternately, apparatus 112 may include detector 94.

When apparatus 112 includes first beam splitter 122 and detector 96, incident beam 70 passes through first beam splitter 122 before entering an x-y deflecting unit 124. X-y deflecting unit 124 determines the position of the point of entry of incident beam 70 into the backside surface of semiconductor substrate 56 in order to illuminate target portion 82 of circuit layer 58. X-y deflecting unit 124 permits the scanning of incident beam 70 across the backside surface of semiconductor substrate 56. Incident beam 70 then passes through a viewing lens 126 and a second beam splitter 128, striking the upper surface of the layer of antireflective coating material 64 upon the backside surface of semiconductor substrate 56. Power supply 72 is operably coupled to circuit layer 58 of integrated circuit 54 and supplies electrical power to the electronic circuit within circuit layer 58 during analysis.

Incident beam 70 enters the backside surface of semiconductor substrate 56 through the layer of antireflective coating material 64, and exit beam 92 emerges from the upper surface of the layer of antireflective coating material 64 as described above. Photons of incident beam 70 reaching target portion 82 of circuit layer 58 stimulate electronic components within target portion 82. As described above, thickness $t_A$ of the layer of antireflective coating material 64 is preferably one-fourth the wavelength of incident beam 70 within the layer of antireflective coating material 64. As a result, no laser light is reflected from the upper surface of the layer of antireflective coating material 64 into the surrounding air, and no laser light is reflected from the underside surface of the layer of antireflective coating material 64 into semiconductor substrate 56.

A visible light source 130 produces visible light for viewing of the upper surface of integrated circuit 54 by a user. Second beam splitter 128 directs visible light produced by visible light source 130 onto the same area or "spot" where incident beam 70 enters the backside surface of semiconductor substrate 56 through the layer of antireflective coating material 64. Visible light reflected from the backside surface of semiconductor substrate 56 follows the same path as exit beam 92. The reflected visible light passes through second beam splitter 128 and into viewing lens 126. Viewing lens 126 directs the reflected visible light into the user's eye 132 as shown.

Apparatus 112 also includes a control unit 134 and a display unit 136. Control unit 134 is coupled to laser source 68 and x-y deflecting unit 124, and controls the actions of laser source 68 and x-y deflecting unit 124. When apparatus 112 implements the first method of the present invention, control unit 134 is coupled to detector 94. Control unit 134 may direct x-y deflecting unit 124 to scan incident beam 70 across the upper surface of the layer of antireflective coating material 64. In this case, detector 94 produces an output signal dependent upon the output voltage produced by power supply 72. Control unit 134 receives the output signal produced by detector 94, computes the response of the electronic circuit as described above, and generates a set of output signals representing a two-dimensional image of the electric fields within circuit layer 58. Display device 136 receives the set of output signals from control unit 134 and visually displays the two-dimensional image of the electronic components within circuit layer 58.

When apparatus 112 implements the second method of the present invention, control unit 134 is coupled to detector 96. Exit beam 92 follows the same path as incident beam 70, passing through second beam splitter 128, viewing lens 126, and x-y deflecting unit 124. First beam splitter 122 directs exit beam 92 toward detector 96. Control unit 134 may direct x-y deflecting unit 124 to scan incident beam 70 across the upper surface of the layer of antireflective coating material 64. In this case, detector 96 produces an output signal dependent upon the intensity of exit beam 92 emerging from the backside surface of semiconductor substrate 56 through the layer of antireflective coating material 64. Control unit 134 receives the output signal produced by detector 96, computes the response of the electronic circuit as described above, and generates a set of output signals representing a two-dimensional image of the electronic components within circuit layer 58. Display device 136 receives the set of output signals from control unit 134 and visually displays the two-dimensional image of the electronic components within circuit layer 58.

It is noted that the methods described herein are primarily directed to integrated circuits formed upon semiconductor substrates having: (i) inaccessible frontside surfaces having circuit layers formed thereupon (e.g., flip chip device packages), and (ii) circuit layers including multiple metal interconnect layers which impede analysis of the underlying semiconductor substrate through the frontside surface. As stated above, the methods described herein are applicable to both packaged and unpackaged integrated circuits.

It will be appreciated by those skilled in the art having the benefit of this disclosure that this invention is believed to be methods for analyzing an electronic circuit formed upon a frontside surface of a semiconductor substrate involving forming an antireflective coating upon a backside surface of the substrate prior to detecting electromagnetic radiation emanating from the backside surface. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for analyzing an electronic circuit formed upon a frontside surface of a semiconductor substrate having opposed frontside and backside surfaces, the method comprising:

forming a layer of an antireflective coating material upon the backside surface, wherein the antireflective coating has a refractive index substantially equal to the square root of the product of the refractive indices of the substrate and an ambient surrounding the substrate;

directing a beam of electromagnetic radiation toward the backside surface; and detecting a response from the electronic circuit.

2. The method as recited in claim 1, wherein the forming step comprises coating a layer of lead fluoride ($PbF_2$) upon the backside surface.

3. The method as recited in claim 1, further comprising supplying electrical voltage and current to the electronic circuit prior to the directing step.

4. The method as recited in claim 3, wherein the magnitude of the electrical current is held constant, and wherein the magnitude of the electrical voltage varies in order to maintain the constant electrical current, and wherein the response comprises a change in the magnitude of the electrical voltage.

5. The method as recited in claim 1, wherein the beam of electromagnetic radiation comprises a wavelength at which the substrate is substantially transparent.

6. The method as recited in claim 1, wherein the electromagnetic radiation comprises laser light.

7. The method as recited in claim 1, wherein the forming step comprises coating a layer of $PbF_2$ upon the backside surface to a thickness substantially equal to one quarter wavelength of the electromagnetic radiation.

8. The method as recited in claim 1, further comprising the step of removing material from the backside surface prior to the forming step.

9. A method for analyzing an electronic circuit formed upon a frontside surface of a semiconductor substrate having opposed frontside and backside surfaces, the method comprising:

removing material from the backside surface such that the thickness of the substrate is reduced;

forming a layer of an antireflective coating material upon the backside surface;

supplying electrical voltage and current to the electronic circuit, wherein the magnitude of the electrical current is held constant, and wherein the magnitude of the electrical voltage varies in order to maintain the constant electrical current;

forming a beam of laser light having a wavelength at which the substrate is substantially transparent;

directing the beam of laser light toward the backside surface of the substrate such that a selected portion of the electronic circuit is illuminated by the beam of laser light; and recording a magnitude of the electrical voltage variance.

10. The method as recited in claim 9, wherein a difference between the first and second magnitudes is directly proportional to the change in magnitude of the electrical voltage and is directly dependent upon the presence of an electric field within the selected portion.

11. A method for analyzing an electronic circuit formed upon a frontside surface of a semiconductor substrate having opposed frontside and backside surfaces, the method comprising:

forming a layer of an antireflective coating material upon the backside surface;

directing a beam of electromagnetic radiation toward the backside surface; and detecting a portion of the beam of electromagnetic radiation reflected by the electronic circuit.

12. The method as recited in claim 11, wherein the forming step comprises forming a layer of lead fluoride ($PbF_2$) upon the backside surface.

13. The method as recited in claim 11, further comprising supplying electrical power to the electronic circuit prior to the directing step.

14. The method as recited in claim 11, wherein the beam of electromagnetic radiation comprises a wavelength at which the substrate is substantially transparent.

15. The method as recited in claim 11, wherein the electromagnetic radiation comprises laser light.

16. The method as recited in claim 11, wherein the forming step comprises coating a layer of $PbF_2$ upon the backside surface to a thickness approximately equal to one quarter wavelength of the electromagnetic radiation.

17. The method as recited in claim 11, further comprising the step of removing material from the backside surface prior to the forming step.

18. A method for analyzing an electronic circuit formed upon a frontside surface of a semiconductor substrate having opposed frontside and backside surfaces, the method comprising:

removing material from the backside surface such that the thickness of the substrate is reduced;

forming a layer of an antireflective coating material upon the backside surface;

supplying electrical power to the electronic circuit;

forming a beam of laser light having a wavelength at which the substrate is substantially transparent and is formed having a pre-defined intensity;

directing the beam of laser light toward the backside surface of the substrate such that a selected portion of the electronic circuit is illuminated by the beam of laser light;

measuring the intensity of a portion of the beam of laser light reflected by the selected portion of the electronic circuit; and determining electrical characteristics of the selected portion by calculating the ratio of the measured intensity to the pre-defined intensity.

19. The method as recited in claim 18, wherein the ratio is directly dependent upon the presence of an electric field within the selected portion.

20. A method for analyzing an electronic circuit formed upon a frontside surface of a semiconductor substrate having opposed frontside and backside surfaces, the method comprising:

forming a layer of an antireflective coating material upon the backside surface;

supplying electrical power to the electronic circuit which responds by emitting electromagnetic radiation from defective regions of the electronic circuit; and detecting a portion of the electromagnetic radiation exiting from the backside surface.

21. The method as recited in claim 20, wherein the forming step comprises forming a layer of lead fluoride ($PbF_2$) upon the backside surface.

22. The method as recited in claim 20, wherein the electromagnetic radiation comprises near infrared radiation.

23. The method as recited in claim 20, wherein the thickness of the antireflective coating is approximately one quarter wavelength of the electromagnetic radiation.

24. The method as recited in claim 20, wherein the electromagnetic radiation is within a quantifiable range of near infrared radiation.

25. The method as recited in claim 24, further comprising the step of removing material from the backside surface prior to the forming step.

26. The method as recited in claim 24, wherein the detecting step comprises positioning a detector above the backside surface of the substrate, wherein the detector is configured to detect the portion of the electromagnetic radiation exiting the backside surface.

27. A method for analyzing an electronic circuit formed upon a frontside surface of a semiconductor substrate having opposed frontside and backside surfaces, the method comprising:

forming a layer of lead fluoride ($PbF_2$) upon the backside surface;

directing a beam of electromagnetic radiation toward the backside surface; and detecting a response from the electronic circuit.

28. A method for analyzing an electronic circuit formed upon a frontside surface of a semiconductor substrate having opposed frontside and backside surfaces, the method comprising:

forming a layer of anti-reflective coating material upon the backside surface;

supplying electrical voltage and current to the electronic circuit;

directing a beam of electromagnetic radiation toward the backside surface; and detecting a response from the electronic circuit.

29. The method as recited in claim 28, wherein the magnitude of the electrical current is held constant, and wherein the magnitude of the electrical voltage varies in order to maintain the constant electrical current, and wherein the response comprises a change in the magnitude of the electrical voltage.

30. The method as recited in claim 27, wherein the beam of electromagnetic radiation comprises a wavelength at which the substrate is substantially transparent.

31. The method as recited in claim 27, wherein the electromagnetic radiation comprises laser light.

32. The method as recited in claim 27, wherein the layer of $PbF_2$ is formed to a thickness substantially equal to one quarter wavelength of the electromagnetic radiation.

33. The method as recited in claim 27, further comprising the step of removing material from the backside surface prior to the forming step.

* * * * *